US008596732B2

(12) United States Patent
Kojima

(10) Patent No.: US 8,596,732 B2
(45) Date of Patent: Dec. 3, 2013

(54) LIQUID DROPLET DISCHARGING APPARATUS

(75) Inventor: Kenji Kojima, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 350 days.

(21) Appl. No.: 13/035,282

(22) Filed: Feb. 25, 2011

(65) Prior Publication Data
US 2011/0210993 A1 Sep. 1, 2011

(30) Foreign Application Priority Data

Mar. 1, 2010 (JP) ................................. 2010-043797

(51) Int. Cl.
B41J 29/38 (2006.01)
B41J 2/01 (2006.01)
(52) U.S. Cl.
USPC .............................................. 347/4; 347/104
(58) Field of Classification Search
USPC .............................. 347/4, 101–104, 5, 16, 19
IPC ................................................ B41J 2/01,29/38
See application file for complete search history.

(56) References Cited

U.S. PATENT DOCUMENTS

| 6,224,459 | B1 * | 5/2001 | Stocker et al. ........................ 451/5 |
| 2006/0075625 | A1 * | 4/2006 | Schuster ............................ 29/563 |
| 2006/0181567 | A1 * | 8/2006 | Tezuka ............................... 347/22 |
| 2007/0211129 | A1 * | 9/2007 | Sakamoto ........................ 347/104 |
| 2008/0088662 | A1 * | 4/2008 | Kojima ............................. 347/19 |
| 2009/0058972 | A1 * | 3/2009 | Ando et al. ..................... 347/104 |
| 2009/0189938 | A1 * | 7/2009 | Kojima ............................. 347/14 |
| 2009/0266297 | A1 * | 10/2009 | Ikushima ........................ 118/708 |
| 2010/0165065 | A1 * | 7/2010 | Nakajima et al. ............. 347/104 |

FOREIGN PATENT DOCUMENTS

JP 2008-225246 A 9/2008

* cited by examiner

Primary Examiner — Manish S Shah
Assistant Examiner — Roger W Pisha, II
(74) Attorney, Agent, or Firm — Global IP Counselors, LLP

(57) ABSTRACT

A liquid droplet discharging apparatus includes a pair of workpiece stages, a workpiece moving table configured to move the two workpiece stages, a head moving table configured to move a functional liquid droplet discharging head, a pair of workpiece exchanging mechanisms arranged in two workpiece exchange areas, and a control unit. The control unit is configured to execute control to move the workpiece stages alternately between the image formation area and the workpiece exchange areas such that one of the workpiece stages moves between the image formation area and one of the workpiece exchange areas and the other of the workpiece stages moves between the image formation area and the other of the workpiece exchange areas. Furthermore, the control unit executes control such that image forming operations and exchanges of workpieces are executed alternately with respect to each of the workpiece stages.

9 Claims, 6 Drawing Sheets

LIQUID DROPLET DISCHARGING APPARATUS

CROSS-REFERENCE TO RELATED APPLICATIONS

This application claims priority to Japanese Patent Application No. 2010-043797 filed on Mar. 1, 2010. The entire disclosure of Japanese Patent Application No. 2010-043797 is hereby incorporated herein by reference.

BACKGROUND

1. Technical Field

The present invention relates to a liquid droplet discharging apparatus having a pair of workpiece tables and configured to alternately form images on workpieces mounted on the workpiece tables and execute exchanges of workpieces with respect to the workpiece tables.

2. Related Art

A known example of this kind of liquid droplet discharging apparatus has a pair of workpiece stages arranged in a stationary manner and a head moving mechanism having a line-type functional liquid droplet discharging head mounted thereon and configured to move the functional liquid droplet discharging head between a pair of image forming stages. The liquid droplet discharging apparatus forms an image on a workpiece by moving the functional liquid droplet discharging head between the two image forming stages (see Japanese Laid-Open Patent Publication No. 2008-225246).

SUMMARY

With this kind of liquid droplet discharging apparatus, although the workpiece processing cycle time can be shortened by exchanging workpieces with respect to one workpiece stage while forming an image on a workpiece carried on the other workpiece stage, the functional liquid droplet discharging head cannot be scanned in a precise manner because a movement distance of the head moving mechanism is excessively long. Consequently, the image quality is degraded.

The object of the present invention is to provide a liquid droplet discharging apparatus that can shorten a workpiece processing cycle time without degrading an image quality.

A liquid droplet discharging apparatus according to a first aspect of the present invention is configured to execute an image forming operation with respect to a workpiece by driving a functional liquid droplet discharging head while moving the workpiece back and forth along a first direction in an image formation area. The liquid droplet discharging apparatus comprises: a pair of workpiece stages each configured to have a workpiece set thereon; a workpiece moving table configured to move the two workpiece stages individually in the first movement direction; a head moving table configured to move the functional liquid droplet discharging head in a second direction that is perpendicular to the first direction; a maintenance unit arranged in a maintenance area separated from the image formation area in the second direction and configured to perform maintenance with respect to the functional liquid droplet discharging head; a pair of workpiece exchanging mechanisms arranged in two workpiece exchange areas located on opposite sides of the image formation area in positions separated from the image formation area along the first direction and configured to perform exchanges of workpieces with respect to the workpiece stages; and a control unit configured to control the workpiece moving table, the head moving table, the maintenance unit, and the pair of workpiece exchanging mechanisms. The control unit is configured to execute control to move the pair of workpiece stages alternately between the image formation area and the workpiece exchange areas such that one of the workpiece stages moves between the image formation area and one of the workpiece exchange areas and the other of the workpiece stages moves between the image formation area and the other of the workpiece exchange areas, and to execute control such that image forming operations and exchanges of workpieces are executed alternately with respect to each of the workpiece stages.

With such a configuration, the two workpiece stages can be alternately moved to the image formation area by the stage moving mechanism while loaded with a workpiece and images can be formed on workpieces (workpieces can be processed) in a continuous fashion. Also, since the apparatus is structured such that the workpiece is moved in order to execute image formation, a high degree of mechanical precision can be maintained even if the movement stroke length is large and, thus, a high image quality can be maintained.

The liquid droplet discharging apparatus preferably further comprises a single inspection stage configured to be mounted on the workpiece moving table and to receive an inspection discharge from the functional liquid droplet discharging head and a pair of image recognizing sections that are arranged in two inspection areas positioned between the image formation area and each of the workpiece exchange areas and configured to inspect inspection discharge results discharged onto the inspection stage, and the control unit preferably executes control such that the inspection stage is moved alternately between the pair of inspection areas such that inspection discharges conducted together with image forming operations and inspections of inspection discharge results conducted during subsequent image forming operations following the inspection discharges are executed alternately.

With these constituent features, while one workpiece stage is being used to execute image formation, the inspection stage can be moved to the inspection area on the side where the other workpiece stage is located such that the image recognizing sections can execute a discharge inspection during the image forming operation. In other words, while image formation is being executed with respect to a workpiece, a preceding inspection discharge can be inspected. Thus, overall, workpieces can be processed more efficiently and the cycle time can be shortened. Also, since discharge inspections are accomplished using one inspection stage instead of two, the structure of the apparatus can be simplified.

The control unit is preferably configured to execute control such that each of the workpiece stages is moved back and forth along a first direction in the image formation area a plurality of times to execute the image forming operation and such that, when a final return operation of the back and forth movements is executed, the inspection stage is moved from one inspection area to the other inspection area in synchronization with the return operation and an inspection discharge is executed in synchronization with this movement.

With these constituent features, since the inspection stage passes through the image formation area and receives an inspection discharge in synchronization with a final return operation of one of the workpiece stages, an inspection discharge can be conducted immediately after an image forming operation is executed with respect to one of the workpiece stages and immediately before an image forming operation is executed with respect to the other of the workpiece stages. Consequently, inspection discharges can be executed with respect to the inspection stage without delaying the continuously executed image forming operations and workpieces can be processed more efficiently. Furthermore, since the inspection discharges are executed together with the image forming operations, the time loss incurred for an inspection discharge can be suppressed and an inspection discharge closely aligned with a discharge actually executed with respect to a workpiece can be achieved.

The control unit is preferably configured to control a discharge inspection executed during an image forming operation such that the discharge inspection is completed by the time the image forming operation is completed.

With such a control scheme, since an image forming operation and a discharge inspection can be executed simultaneously with respect to one of the workpieces, a sufficient amount of time can be secured for the discharge inspections while also improving the efficiency with which workpieces are processed.

The apparatus is preferably configured such that the image formation area has a length at least as long as two workpiece stages in an X-axis direction, such that each of the inspection areas has a length at least as long as the inspection stage in the X-axis direction, and such that each of the workpiece exchange areas has a length at least as long as one workpiece stage in the X-axis direction.

With these constituent features, an image forming operation and a workpiece exchange operation can be executed in parallel with each other because a workpiece can be in the image formation area while another workpiece is in one of the workpiece exchange areas simultaneously. A discharge inspection can also be performed in parallel with an image forming operation and a workpiece exchange operation because the inspection stage can be in the inspection area simultaneously.

It is also preferable if the maintenance unit has a suction unit configured to suck functional liquid from the functional liquid droplet discharging head and a wiping unit configured to wipe a nozzle face of the functional liquid droplet discharging head.

With these constituent features, the discharge function of the functional liquid droplet discharging head can be renewed and a precise image forming operation can be accomplished.

The apparatus preferably includes a plurality of carriage units arranged on the head moving table so as to be aligned along the second direction, each of the carriage units including a plurality of functional liquid droplet discharging heads.

Additionally, the head moving table is preferably contrived such that it can move each of the carriage units independently.

With these constituent features, image formation can be conducted with a high degree of precision because the image forming operation is executed while moving the carriage units independently.

BRIEF DESCRIPTION OF THE DRAWINGS

Referring now to the attached drawings which form a part of this original disclosure.

DETAILED DESCRIPTION OF EXEMPLARY EMBODIMENTS

A liquid droplet discharging apparatus according to an embodiment of the present invention will now be explained with reference to the appended drawings. This liquid droplet discharging apparatus is intended to be installed in a manufacturing line for flat panel displays and uses a functional liquid droplet discharging head supplied with a functional liquid—e.g., a special ink or a liquid resin having a light emitting property—to form (image formation) a color filter of a liquid crystal display device or light emitting elements serving as pixels of an organic EL device.

Figure 1:
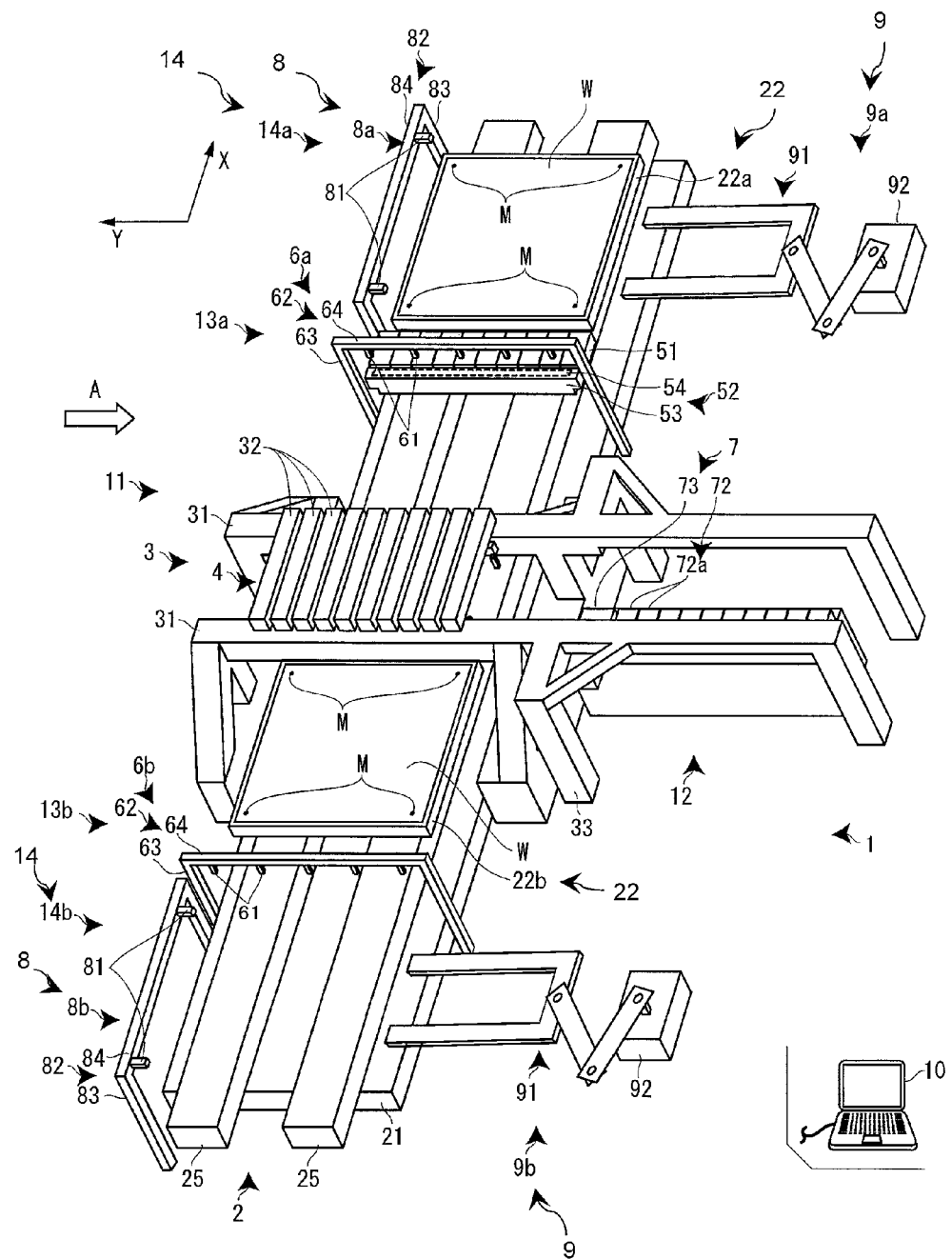
FIG. 1 is a perspective view showing an external appearance of a liquid droplet discharging apparatus according to an embodiment.
Figure 2:
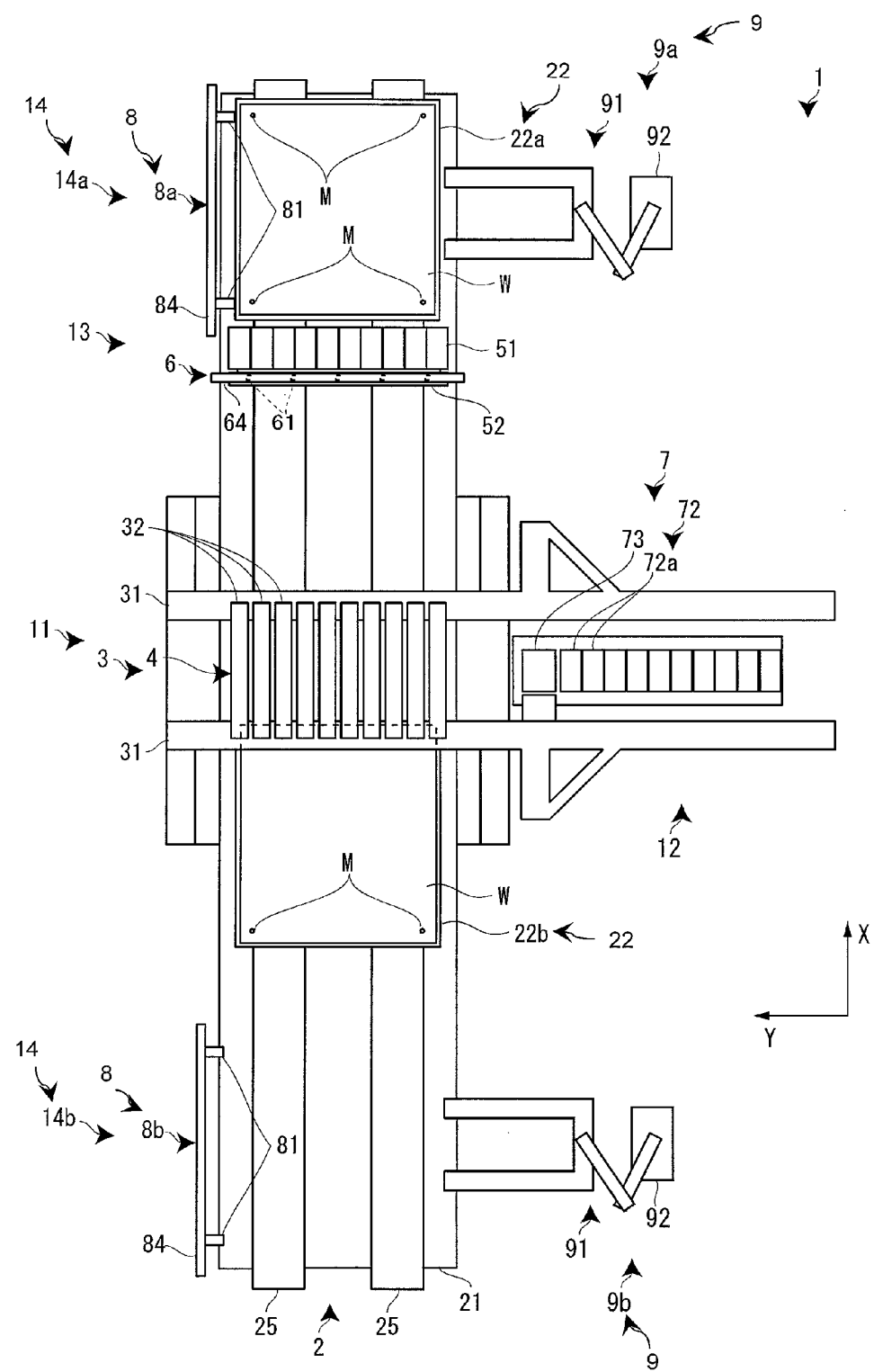
FIG. 2 is a top plan view of the liquid droplet discharging apparatus.
Figure 3:
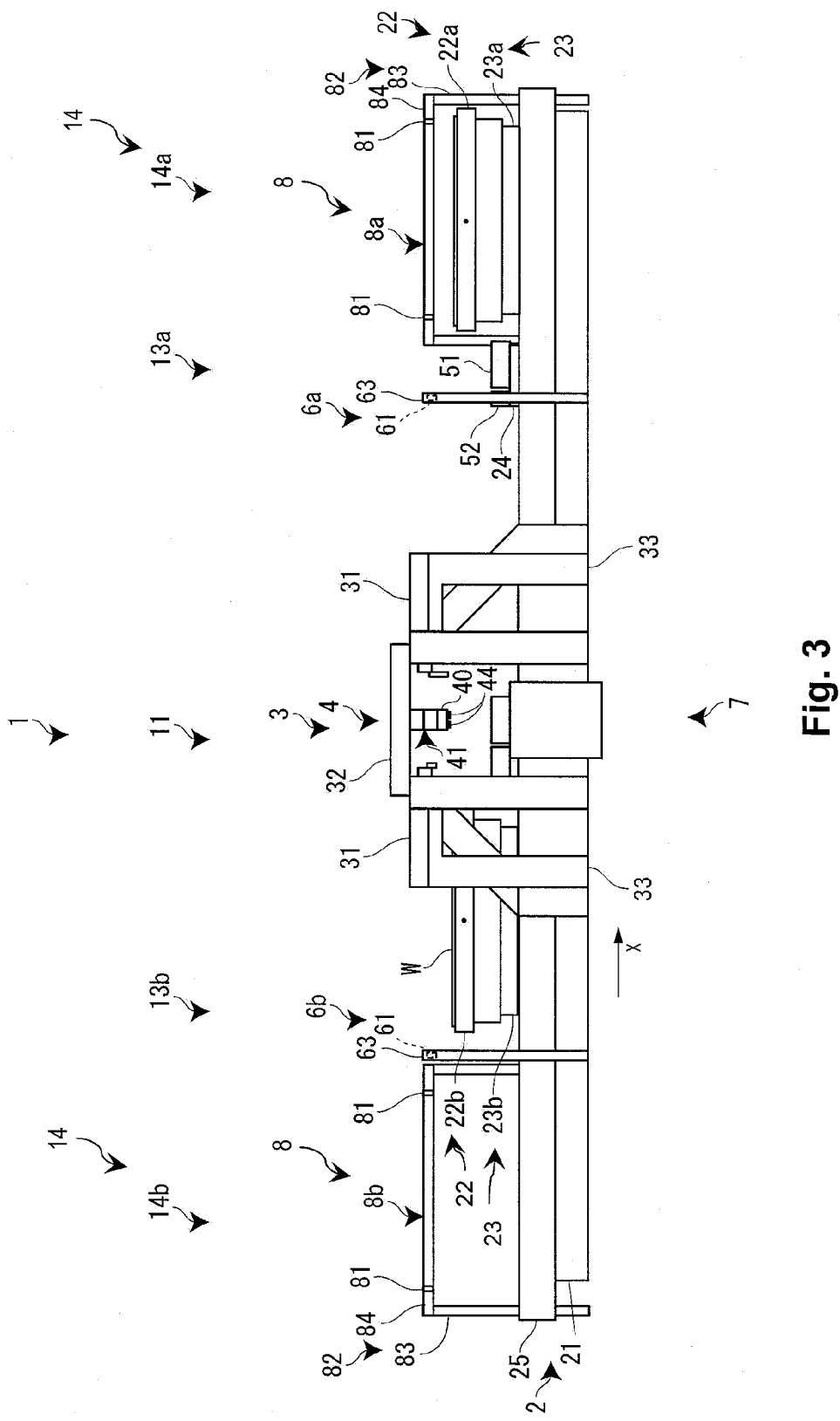
FIG. 3 is a side view of the liquid droplet discharging apparatus.

As shown in FIGS. 1 to 3, the liquid droplet discharging apparatus 1 includes the following: an X axis table 2 (stage moving mechanism) that is arranged on an X axis support base 21 supported on a base such as a granite surface plate, extends in an X axis direction serving as a main scanning direction, and configured to move a workpiece W along the X axis direction; a Y axis table 3 that extends in a Y axis direction serving as a subordinate scanning direction and is arranged on a pair of Y axis support bases 31 arranged on a plurality of supports 33 such that they straddle across the X axis table 2; and a plurality of (e.g., ten) carriage units 4 on which a plurality of functional liquid droplet discharging heads 44 are mounted. The liquid droplet discharging apparatus 1 according the present invention has two (a pair of) workpiece stages contrived for a workpiece W to be set thereon, and the X axis table 2 serves to move the two workpiece stages separately in the X axis direction such that an image forming operation can be conducted alternately with respect to the two workpiece stages.

The liquid droplet discharging apparatus 1 also has a maintenance apparatus 7 (maintenance unit) comprising a suction unit 72 configured to suck a functional liquid from a functional liquid droplet discharging head 44, a wiping unit 73 configured to wipe a nozzle face NF of a functional liquid droplet discharging head 44. The liquid droplet discharging apparatus 1 further includes a weight measuring/flushing unit 51 configured to receive a discharge of functional liquid from a functional liquid discharging head 44 and measure a weight of the discharged functional liquid, a roll paper unit 52 (inspection stage) configured to receive an inspection discharge from a functional liquid discharging head 44, a pair of image recognizing units 6 (image recognizing sections) configured to execute image recognition with respect to a discharge result on the roll paper unit 52, a pair of alignment units 8 configured to execute an alignment of a workpiece W, and a pair of workpiece exchanging units 9 (workpiece exchanging mechanisms) configured to supply and remove workpieces W.

The liquid droplet discharging apparatus 1 further includes a chamber (not shown in drawings) serving to enclose the components described heretofore in an atmosphere in which temperature and humidity are controlled, a functional liquid supplying unit (not shown in drawings) configured to supply the functional liquid through the chamber to the functional liquid droplet discharging heads 44, and a control device 10 serving to execute general control of the entire apparatus. A plurality of main tank units (not shown in drawings) forming a main component of the functional liquid supplying unit are arranged on a portion of a side wall of the chamber.

An image formation area 11 where workpieces W undergo an image forming process is established in an intersecting region of the X axis table 2 and the Y axis table 3, and a maintenance area 12 in which the suction unit 72 and the wiping unit 73 are arranged is provided in a region where the Y axis table 3 moves along Y axis direction from the image formation area 11. A first inspection area 13a and a second inspection area 13b are established on opposite sides of the image formation area 11 in positions separated outwardly along the X axis direction and serve as areas for inspecting results of inspection discharges discharged from the functional liquid droplet discharging head 44. Additionally, a first workpiece exchange area 14a and a second workpiece exchange area 14b are established on opposite sides of the inspection areas in positions separated farther outwardly along the X axis direction and serve as areas where workpieces W are supplied to and removed from the apparatus. Thus, in the liquid droplet discharging apparatus 1, the image formation area 11 is provided in a center position along the X axis direction and the pairs of inspection areas 13 and the pairs of workpiece exchange areas 14 are provided in positions located outwardly from the image formation area 11 along the X axis.

The image formation area 11 is at least as long as two workpieces W (two workpiece stages) in an X axis direction, and an image forming process is executed with respect to a workpiece W by moving the workpiece W back and forth a plurality of times along the X axis direction in an area centered on a position aligned with the plurality of carriage units 4 (plurality of functional liquid droplet discharging heads 44). The first inspection area 13a and the second inspection area 13b are each at least wide enough in the X axis direction for the roll paper unit 52 and the weight measuring/flushing unit 51 to be arranged therein, and the first image recognizing unit 6a and the second image recognizing unit 6b are arranged above. After receiving an inspection discharge from the functional liquid droplet discharging heads 44 (carriage unit 4), the roll paper unit 52 moves to the first inspection area 13a or the second inspection area 13b and the discharge result on the roll paper unit 52 is subjected to a discharge inspection by image recognition. The first workpiece exchange area 14a and the second workpiece exchange area 14b are each at least as wide in the X axis direction as one workpiece W (one workpiece stage). A first workpiece exchanging unit 9a and a second workpiece exchanging unit 9b are arranged in positions offset in a Y axis direction and serve to supply and remove workpieces W to and from the first workpiece stage 22a and the second workpiece stage 22b, respectively, in the respective exchange areas. Thus, in the X axis direction, the liquid droplet discharge apparatus 1 is at least as long as four workpiece stages and has approximately the same total length as the roll paper unit 52, the weight measuring/flushing unit 51, and the functional liquid droplet discharging heads 44 (head unit 40) combined.

The X axis table 2 has a pair of X axis guide rails 25 that extend in an X axis direction from the first workpiece exchange area 14a to the second workpiece exchange area 14b (the guide rails 25 are actually formed by both side faces of the X axis support base 21), a first workpiece stage 22a and a second workpiece stage 22b mounted on the pair of X axis guide rails 25, a first stage slider 23a and a second stage slider 23b configured to move the first workpiece stage 22a and the second workpiece stage 22b along the X axis guide rails 25, and a roll paper slider 24 configured to move the roll paper unit 52 along the X axis guide rails 25. The first workpiece stage 22a and the second workpiece stage 22b are each configured to hold a workpiece W with suction and each has a mechanism that can execute rotation and raising and lowering. In this embodiment, the weight measuring/flushing unit 51 is mounted on the roll paper slider 24 such that the weight measuring/flushing unit 51 moves in synchronization with the roll paper unit 52.

The first stage slider 23a moves the first workpiece stage 22a between the image formation area 11 and the first workpiece exchange area 14a using linear motor drive. Meanwhile, the second stage slider 23b moves the second workpiece stage 22b between the image formation area 11 and the first workpiece exchange area 14b using linear motor drive. The roll paper slider 24 moves the roll paper unit 52 and the weight measuring/flushing unit 51 between the first inspection area 13a and the second inspection area 13b using linear motor drive. A stator of the linear motor is arranged to extend along an X axis guide rail 25, and the linear motor has a plurality of sliders each corresponding to one of the stages. The linear motor serves to move the stages along the movement axis in this embodiment. Thus, the first workpiece stage 22a, the second workpiece stage 22b, and the roll paper unit 52 can be moved independently.

The Y axis table 3 extends in the Y axis direction so as to straddle the X axis table 2 and includes a Y axis guide rail (not shown in drawings) provided on a pair of Y axis support bases 31 that extend across the image formation area 11 to the maintenance area 12, a plurality of bridge plates 32 that are mounted to span across the pair of X axis guide rails 25 and have the carriage units 4 suspended there-from, and a carriage slider (not shown in drawings) configured to move the carriage units 4 along the Y axis guide rails by moving the bridge plates 32. The carriage slider is contrived such that the carriage units 4 can be moved independently by linear motor drive (it is also possible to move a plurality of the carriage units 4 as a group). The carriage slider serves to scan the functional liquid droplet discharging heads 44 (carriage unit 4) along the Y axis direction within the imaging area during an image formation operation and also to move the functional liquid droplet discharging heads 44 between the image formation area 11 and the maintenance area 12. Here, too, the linear motor has a stator arranged to extend along the Y axis guide rail and a plurality of sliders that each correspond to one of the carriage sliders.

Figure 4:
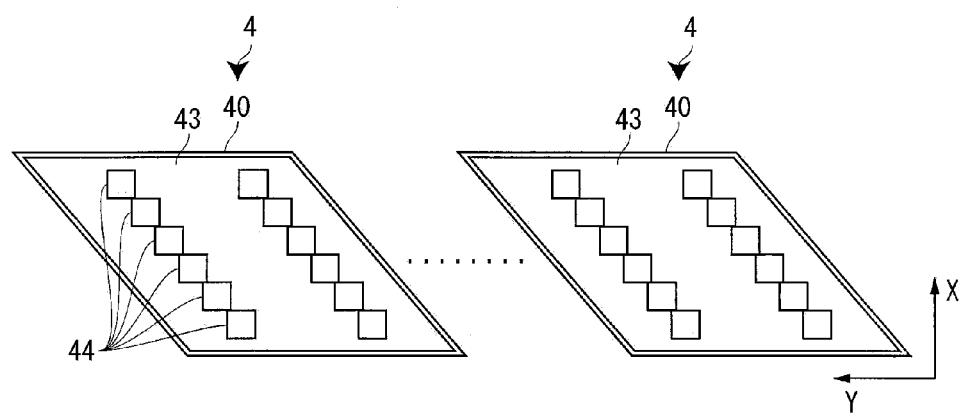
FIG. 4 is a planar view showing carriage unit in a simplified manner.

As shown in FIGS. 3 and 4, each of the carriage units 4 comprises a head unit 40 equipped with twelve functional liquid droplet discharging heads 44 and a head rotating mechanism 41 configured to support the head unit 40 on the Y axis table 3 such that the head unit 40 can rotate and move up and down freely. A sub tank unit (not shown in drawings) connected to the main tank units is arranged on each of the bridge plates 32 from which the carriage units 4 are suspended. The sub tank units serve to supply the functional liquid to the functional liquid droplet discharging heads 44 using natural head pressure.

As shown in FIG. 4, a head unit 40 has a generally rectangular carriage plate 43 with six functional liquid droplet discharging heads 44 attached on a right side and six functional liquid droplet discharging heads 44 attached on a left side. Left-right pairs (two) functional liquid droplet discharging heads 44 discharge the same type of functional liquid and the six pairs of functional liquid droplet discharging heads 44 are arranged in a stair-like fashion from a higher position to a lower position. The two same-color functional liquid droplet discharging heads 44 of each pair are configured such that a nozzle line NL thereof is continuous in a Y axis direction and forms one partial image forming line. The number of carriage units 4 and the number of functional liquid droplet discharging heads 44 provided on each of the carriage units 4 are arbitrary.

Figure 5A:
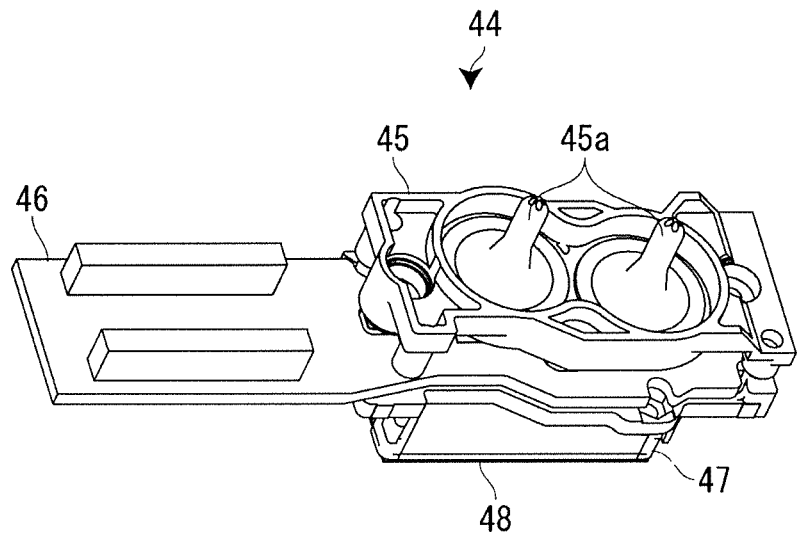
FIG. 5A is a perspective view showing a front side of a functional liquid droplet discharging head.
Figure 5B:
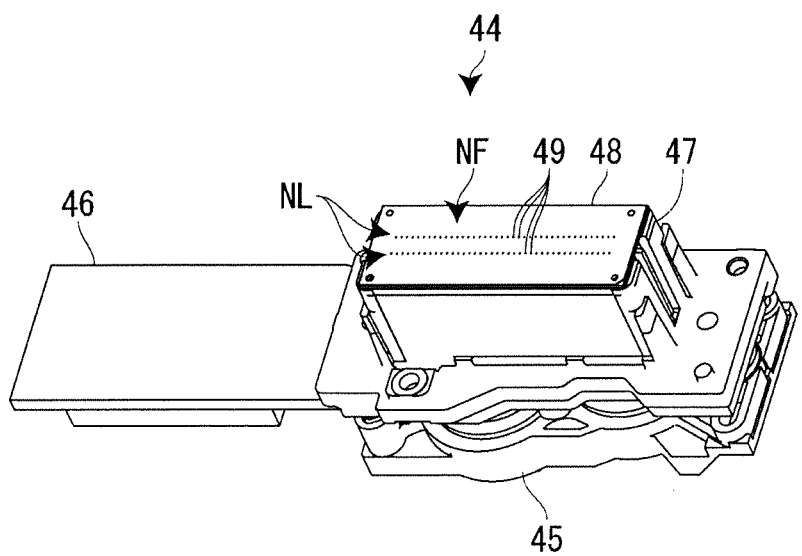
FIG. 5B is a perspective view showing a rear side of the functional liquid droplet discharging head.

As shown in FIG. 5, each of the functional liquid droplet discharging heads 44 is a so-called dual connection inkjet head and comprises a functional liquid inlet section 45 having two connecting needles 45a, a dual-connection head base plate 46 connecting to a side of the functional liquid inlet section 45, a dual-connection pump section 47 connected below the head base plate 46, and a nozzle plate 48 connected to the pump section 47. Two rows of nozzles forming two nozzle lines NL are provided in a parallel arrangement in the nozzle face NF of the nozzle plate 48, and each of the nozzle lines NL comprises a plurality of discharge nozzles 49 arranged at an equal pitch (see FIG. 5B). The previously mentioned control device 10 is connected to the head base plate 46 and the functional liquid is discharged from the discharge nozzles 49 when a drive signal outputted from the control device 10 is applied to (a piezoelectric element of) the pump section 47.

As shown in FIG. 1 and FIG. 2, the suction unit 72 is fixedly arranged directly below the carriage units 4 in the maintenance area 12 and comprises a number of individual suction units 72a equal to the number of carriage units 4. Each of the individual suction units 72a comprises a cap unit having twelve head caps corresponding to the twelve functional liquid droplet discharge heads 44, a suction mechanism connected to the cap units, and an elevator mechanism configured to raise and lower the cap unit (none of these components are shown in the drawings). The individual suction units 72a are configured to raise and lower the cap units in three stages among a close contact position used for storage and for sucking functional liquid, a separated position for flushing, and a replacement position for replacing expendable parts of the cap unit and replacing the head unit 40.

Similarly to the suction unit 72, the wiping unit 73 is fixedly arranged near the image formation area 11 side of the suction unit 72 and comprises a dispensing reel onto which a wiping sheet is wound in a roll form, a winding reel serving to wind in the wiping sheet dispensed from the dispensing reel, and a pressing roller serving to press a portion of the wiping sheet spanning between the reels against the functional liquid droplet discharging heads 44 (none of these parts is shown in the drawings). The wiping unit 73 is configured to press the wiping sheet against the functional liquid droplet discharging head 44 with the pressing roller and move the entire wiping sheet in an X axis direction while dispensing and winding in the wiping sheet. In this way, the wiping unit 73 wipes the nozzle face NF of the functional liquid droplet discharging heads 44 of the carriage units 4.

As shown in FIGS. 1 to 3, the weight measuring/flushing unit 51 is arranged between the pair of workpiece stages 22 near the first workpiece exchange area 14a side of the roll paper unit 52 and supported on the roll paper slider 24 such that it can slide freely with respect to the X axis guide rails 25 in synchronization with the roll paper unit 52. The weight measuring/flushing unit 51 has a flushing box configured to catch functional liquid discharged from the functional liquid droplet discharging heads 44 and a scale unit configured to measure a weight of the functional liquid. The flushing box and the scale unit are joined as a one piece integral unit, and the flushing box is arranged on the roll paper unit 52 side of the weight measuring/flushing unit 51.

The flushing box catches waste discharge (flushed liquid) from the functional liquid droplet discharging head 44 to stabilize the functional liquid droplet discharging performance of the functional liquid droplet discharging heads 44. The scale unit has a plurality of electronic balances and a plurality of bearing saucers holding the electronic balances (neither shown in drawings) and serves to measure a weight of functional liquid discharged from the functional liquid droplet discharging head 44. It is also acceptable to provide a moving mechanism for moving the weight measuring/flushing unit 51 in the X axis direction such that it can be moved independently of the roll paper unit 52. The flushing box is used when the image forming operation is temporarily stopped, such as when a discharge inspection is no good (NG), and the scale unit is used when a head unit 40 is changed. Although in this embodiment the weight measuring/flushing unit 51 functions both to catch waste functional liquid discharges from the functional liquid droplet discharging heads 44 and to measure the weight of the discharged functional liquid, it is acceptable if the weight measuring/flushing unit 51 has served at least one of these functions.

The roll paper unit 52 is arranged between the first workpiece stage 22a and the second workpiece stage 22b and is supported by the roll paper slider 24 such that it slides freely with respect to the X axis guide rails 25. The roll paper unit 52 comprises a dispensing mechanism (not shown) configured to dispense an inspection sheet 53 provided in a roll form, a winding mechanism (not shown) configured to wind up a used portion of the inspection sheet after an inspection, and a suction stage 54 configured to use suction to hold a portion of the inspection sheet 53 dispensed from the dispensing mechanism. The roll paper unit 52 is configured to receive an inspection discharge from the functional liquid droplet discharging heads 44 while holding a portion of the inspection sheet 53 dispensed from the dispensing mechanism with suction on the suction stage 54. The roll paper unit 52 is further configured to wind in the used portion of the inspection sheet with the winding mechanism and dispense a fresh portion of the inspection sheet 53 to the suction stage 54. Actually, the inspection sheet 53 is wound in by the winding mechanism and a fresh portion of the inspection sheet 53 is dispensed to the suction stage 54 when several inspection discharges have been executed and there is no more blank space available on the inspection sheet 53. The roll paper unit 52 moves between the first inspection area 13a and the second inspection area 13b and receives an inspection discharge from the functional liquid droplet discharging heads 44 in the image formation area 11 while it is moving. The discharge results are then inspected by image recognition alternately at the first inspection area 13a or the second inspection area 13b.

The image recognizing unit 6 has a first image recognizing unit 6a arranged in the first inspection area 13a and a second image recognizing unit 6b arranged in the second inspection area 13b. The first image recognizing unit 6a executes image recognition with respect to the inspection sheet 53 when the roll paper unit 52 has moved to the first inspection area 13a, and the second image recognizing unit 6b executes image recognition with respect to the inspection sheet 53 when the roll paper unit 52 has moved to the second inspection area 13b. The first image recognizing unit 6a and the second image recognizing unit 6b have the same constituent features and each includes a plurality of (e.g., five) inspection cameras 61 arranged to face the roll paper unit 52 from above, a plurality of camera platforms (not shown in drawings) configured to support the inspection cameras 61, a camera frame 62 arranged to span across the X axis table 2 and configured to support the camera platforms such that they can slide freely in the Y axis direction, and a camera moving mechanism (camera table, not shown in drawings) configured to move the inspection cameras 61 along the camera frame 62 in the Y axis direction by moving the camera platforms.

The camera frame 62 is generally shaped like an overarching gateway and comprises support posts 63 arranged on both sides of the X-axis table 2 and a pair of camera guides 64 supported on the support posts 63 so as to extend in the Y-axis direction. The image recognizing unit 6 is configured to execute image recognition with respect to several liquid droplets discharged onto the inspection sheet 53 in a continuous fashion while moving the inspection cameras 61 along the Y axis direction by moving the camera platforms. Since a plurality of inspection cameras 61 are provided, the time required for the image recognition can be shortened. The result of the image recognition inspection is sent to the control device 10 and the control device 10 inspects the discharge performance of the functional liquid droplet discharging head 44 by inspecting for missing dots and curved droplet flight paths.

The workpiece exchange units 9 include a first workpiece exchanging unit 9a arranged to access the first workpiece exchange area 14a from the maintenance area 12 side and a second workpiece exchanging unit 9b arranged to access the second workpiece exchange area 14b from the maintenance area 12 side. The first workpiece exchange unit 9a serves to exchange a workpiece W carried on the first workpiece stage 22a when the first workpiece stage 22a has moved to the first workpiece exchange area 14a, and the second workpiece exchange unit 9b serves to exchange a workpiece W carried on the second workpiece stage 22b when the second workpiece stage 22b has moved to the second workpiece exchange area 14b. The first workpiece exchange unit 9a and the second workpiece exchange unit 9b each have an arm robot 91 configured to perform an exchange operation with respect to a workpiece W and a robot support base 92 configured to support the arm robot 91. The arm robots 91 operate in coordination with the workpiece stages 22, which have an elevator function, to exchange one workpiece W through an exchange opening formed in the chamber (not shown in drawings) while another workpiece W is undergoing an image forming operation. The workpiece exchanging units 9 is omitted in FIG. 3.

The alignment units 8 include a first alignment unit 8a arranged on the opposite side of the first workpiece exchange area 14a as the first workpiece exchanging unit 9a and a second alignment unit 8b arranged on the opposite side of the second workpiece exchange area 14b as the second workpiece exchanging unit 9b. The first alignment unit 8a serves to align a workpiece W supplied to the first workpiece stage 22a when the first workpiece stage 22a has moved to the first workpiece exchange area 14a, and the second alignment unit 8b serves to align a workpiece W supplied to the second workpiece stage 22b when the second workpiece stage 22b has moved to the second workpiece exchange area 14b. The first alignment unit 8a and the second alignment unit 8b have the same constituent features and each includes two alignment cameras 81 arranged to view an alignment mark M formed on a workpiece W from above, two camera platforms (not shown in drawings) serving to support the alignment cameras 81, a camera frame 82 arranged to span alongside the X axis table 2 and serving to support the camera platforms. The camera frame 82 is generally shaped like an overarching gateway and comprises a pair support posts 83 arranged in positions corresponding to the length of the workpiece stage 22 along the X-axis table 2 and a camera guide 84 supported on the support posts 83 so as to extend in the X-axis direction. The two alignment cameras 81 are fixedly supported in positions corresponding to alignment marks M of a workpiece W such that they protrude outward from the camera frame 82 toward the workpiece W.

The alignment units 8 are configured to recognize the alignment marks M of a workpiece W held by suction on a workpiece stage 22 using image recognition and to correct a misalignment of the workpiece W in the X-axis direction and the Y-axis direction by employing the control device 10 to move the X axis table 2, the Y axis table 3, and the workpiece stage 22 in accordance with the amount of misalignment detected in the image recognition result. More specifically, after the misalignment is corrected in the X-axis direction using the stage slider 23 at the workpiece exchange area 14, the misalignment is corrected in the Y-axis direction by moving the carriage units 4 in the Y-axis direction by an amount corresponding to the misalignment using the Y-axis table 3 after the workpiece stage 22 has moved to the image formation area 11. A pair of positioning protrusions (not shown in drawings) for pre-aligning a supplied workpiece W are provided on the workpiece stage 22. The term "workpiece exchange" used herein includes the actions of carrying workpieces W into and out of the workpiece exchange areas 14 (first workpiece exchange area 14a and second workpiece exchange area 14b) executed by the workpiece exchanging units 9 and the actions of aligning workpieces W in the workpiece exchange areas 14 executed by the alignment units 8.

Figure 6:
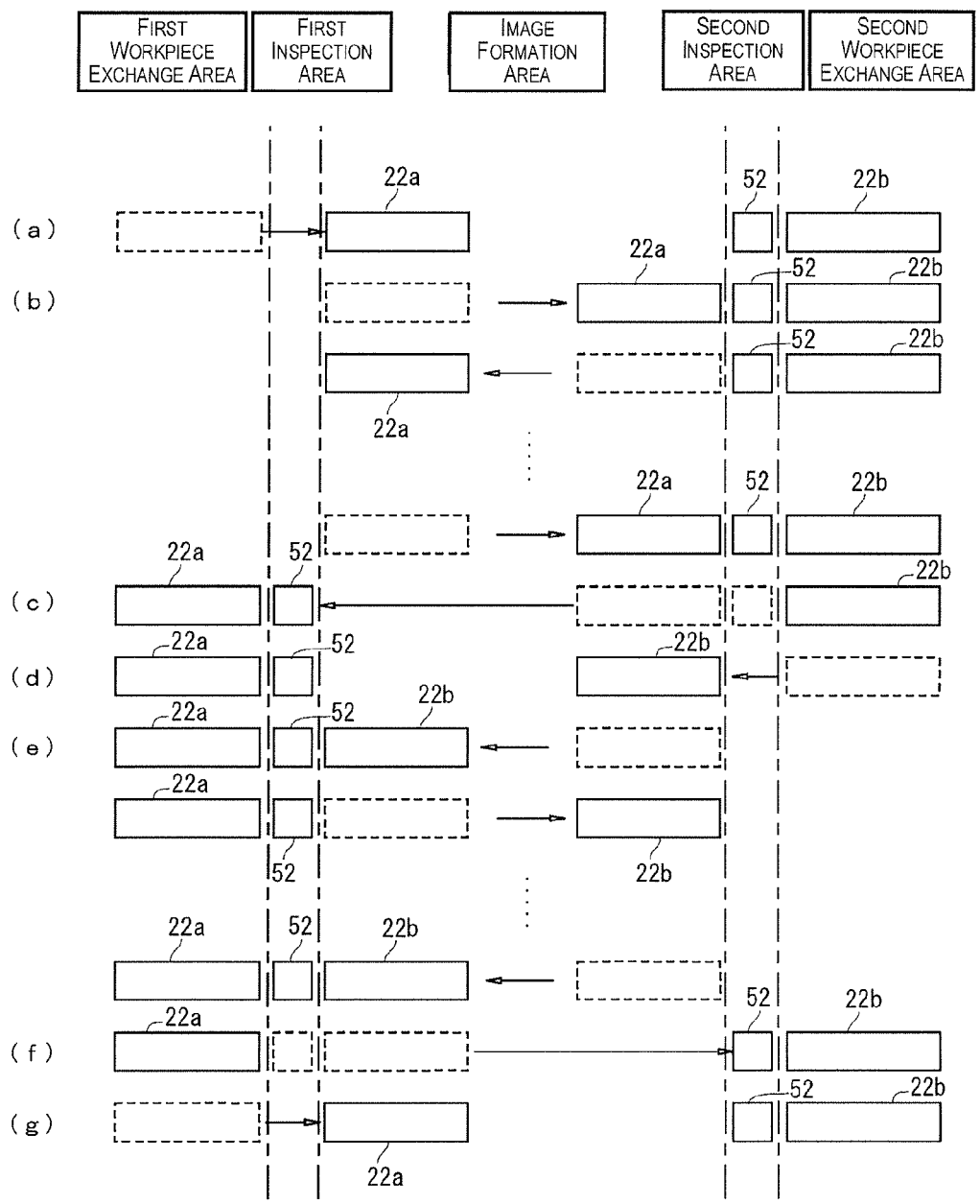
FIG. 6 includes a series of schematic diagrams showing operations executed by the liquid droplet discharging apparatus.

A sequence of workpiece processing operations executed by the liquid droplet discharging apparatus 1 will now be explained with reference to FIG. 6. FIG. 6 is a series of diagrams illustrating positional relationships among the first workpiece stage 22a, the second workpiece stage 22b, and the roll paper unit 52 along the X-axis direction in a simplified manner as viewed from the direction A shown in FIG. 1. The weight measuring/flushing unit 51 arranged near the roll paper unit 52 is omitted in FIG. 6.

After a workpiece W has been supplied to the first workpiece stage 22a by the first workpiece exchanging unit 9a and the workpiece W has been aligned by the first alignment unit 8a, the liquid droplet discharging apparatus 1 (control device 10) moves the first workpiece stage 22a from the first workpiece exchange area 14a to an image formation start position of the image formation area 11 (the diagram (a) of the same figure). After it waits at the image formation start position, the first workpiece stage 22a is moved back and forth within the image formation area 11 several times while functional liquid droplets are discharged onto the workpiece W from the functional liquid droplet discharging heads 44 (carriage units 4), thus executing an image formation operation (the diagram (b) of the same figure). Meanwhile, the roll paper unit 52 is made to wait at the second inspection area 13b while another workpiece W is supplied to the second workpiece stage 22b by the second workpiece exchanging unit 9b and aligned by the second alignment unit 8b at the second workpiece exchange area 14b.

When the first workpiece stage 22a completes a final movement operation, the first workpiece stage 22a executes a final return operation and leaves the image formation area 11 to pass through the first inspection area 13a and arrive at the first workpiece exchange area 14a. Synchronizing with the first workpiece stage 22a executing the final return operation and the movement to the first workpiece exchange area 14a, the roll paper unit 52 passes from the second inspection area 13b through the image formation area 11 and arrives at the first inspection area 13a as though it is following the first workpiece stage 22a (the diagram (c) of FIG. 6). While it is passing (moving) through the image formation area 11, the functional liquid droplet discharging heads 44 execute an inspection discharge onto the roll paper unit 52. Since this inspection discharge is executed as the roll paper unit 52 passes through the image formation area 11 following the first workpiece stage 22a, the inspection discharge is executed the image forming discharge with respect to the first workpiece stage 22a. Thus, there is no time loss associated with the discharge inspection and the inspection discharge is obtained in the same manner as the discharge executed onto the workpiece W, thus enabling a highly meaningful discharge inspection to be accomplished.

In synchronization with the movements of the first workpiece stage 22a and the roll paper unit 52 indicated in the diagram (c) of FIG. 6, the second workpiece stage 22b is moved to the image formation start position of the image formation area 11 carrying another fresh workpiece W (the diagram (d) of FIG. 6). The events of the diagram (c) and section (d) of FIG. 6 actually occur simultaneously. After it waits at the image formation start position, the second workpiece stage 22b is moved back and forth within the image formation area 11 several times while functional liquid droplets are discharged onto the workpiece W from the functional liquid droplet discharging heads 44 (carriage units 4), thus executing an image formation operation (the diagram (e) of the same figure). Meanwhile, the first workpiece stage 22a carries the workpiece W to the first workpiece exchange area 14a after having completed the image forming operation and the first workpiece exchanging unit 9a removes the processed workpiece W and supplies a fresh workpiece W, which is then aligned with respect to the first workpiece stage 22a. Additionally, the result of the inspection discharge the roll paper unit 52 received as it passed through the image formation area 11 is inspected by the first image recognizing unit 6a in first inspection area 13a. The workpiece exchange operation executed at the first workpiece exchange area 14a, the discharge inspection executed at the first inspection area 13a, and the image forming operation executed at the image formation area 11 are executed in parallel with one another.

When the second workpiece stage 22b completes a final move operation, the second workpiece stage 22b executes a final return operation and leaves the image formation area 11 to pass through the second inspection area 13b and arrive at the second workpiece exchange area 14b. Synchronizing with the second workpiece stage 22b executing the final return operation and the movement to the second workpiece exchange area 14b, the roll paper unit 52 passes from the first inspection area 13a through the image formation area 11 and arrives at the second inspection area 13b as though it is following the second workpiece stage 22b (the diagram (f) of FIG. 6). While it is passing (moving) through the image formation area 11, the functional liquid droplet discharging heads 44 execute an inspection discharge onto the roll paper unit 52. That is, the discharge inspection of the roll paper unit 52 executed at the first inspection area 13a is completed by the time the final move operation of the second workpiece stage 22b is finished. In other words, the discharge inspection executed in the first inspection area 13a can be completed in an amount of time equal to the amount of time required to complete the image forming operation executed with respect to the second workpiece stage 22b minus the time required for the final return operation. That is, since substantially the entire amount of time required for the image forming operation at the second workpiece stage 22b can be used for the discharge inspection, a precise and complex discharge inspection can be accomplished. Also, since the first discharge inspection is completed by the time the image forming operation is started with respect to a third workpiece W, the number of defective panels occurring when processing of workpieces first starts can be held to no more than two.

In synchronization with the movements of the second workpiece stage 22b and the roll paper unit 52 indicated in the diagram (f) of FIG. 6, the first workpiece stage 22a is moved to the image formation start position of the image formation area 11 carrying another fresh workpiece W (the diagram (g) of FIG. 6). Thus, the workpiece exchange operation executed with respect to the first workpiece stage 22a at the first workpiece exchange area 14a is completed by the time the image forming operation or, more precisely, the final move operation is finished with respect to the second workpiece stage 22b. The events of the diagram (f) and the diagram (g) of FIG. 6 actually occur simultaneously. Next, an image forming operation is executed with respect to the first workpiece stage 22a at the image formation area 11, workpieces W are exchanged with respect to the second workpiece stage 22b at the second workpiece exchange area 14b, and the result of an inspection discharge executed with respect to the roll paper unit 52 as it passed through the image formation area 11 is inspected by the second image recognizing unit 6b at the second inspection area 13b. The workpiece exchange operation executed at the second workpiece exchange area 14b, the discharge inspection executed at the second inspection area 13b, and the image forming operation executed at the image formation area 11 are executed in parallel with one another. Although in this embodiment each of the workpiece stages 22 waits at the image formation start position of the image formation area 11 before starting the image forming operation, it is also acceptable to contrive the apparatus such that the workpiece stages 22 do not wait at the image formation start position but, instead, continue directly into the back and forth movements (image forming operation) at the image formation area 11 after moving from the workpiece exchange areas 14.

In this way, an image forming operation and a workpiece exchange operation are executed alternately with respect to the first workpiece stage 22a and the second workpiece stage 22b. Thus, workpieces W can be processed with an image forming operation constantly and the overall cycle time can be shortened. It is also possible to provide a standalone roll paper unit 52 that can move independently between the first workpiece stage 22a and the second workpiece stage 22b and to provide two inspection areas 13 (image recognizing units 6) on both sides of the image formation area 11. In this way, the inspection areas 13 can be used as appropriate in accordance with the workpiece stages 22 being processed with an image forming operation and discharge inspections can be conducted in parallel with image forming operations and workpiece exchange operations. Thus, workpieces can be processed even more efficiently and the overall cycle time can be shortened.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A liquid droplet discharging apparatus configured to execute an image forming operation with respect to a workpiece by driving a functional liquid droplet discharging head while moving the workpiece back and forth along a first direction in an image formation area, the liquid droplet discharging apparatus comprising:
    a pair of workpiece stages each configured to support a workpiece thereon;
    a workpiece moving table configured to move the two workpiece stages individually in the first movement direction;
    a head moving table configured to move the functional liquid droplet discharging head in a second direction that is perpendicular to the first direction;
    a maintenance unit arranged in a maintenance area separated from the image formation area in the second direction and configured to perform maintenance with respect to the functional liquid droplet discharging head;
    a pair of workpiece exchanging mechanisms arranged in two workpiece exchange areas positioned such that the image formation area lies therebetween along the first direction, and configured to perform exchanges of workpieces with respect to the workpiece stages;
    a single inspection stage mounted on the workpiece moving table that is configured to receive an inspection discharge from the functional liquid droplet discharging head, the single inspection stage being independently movable with respect to the workpiece stages in the first movement direction; and
    a control unit configured to control the workpiece moving table, the head moving table, the maintenance unit, the workpiece exchanging mechanisms, and the single inspection stage, the control unit being configured to execute control to move the workpiece stages alternately between the image formation area and the workpiece exchange areas such that one of the workpiece stages moves between the image formation area and one of the workpiece exchange areas and the other of the workpiece stages moves between the image formation area and the other of the workpiece exchange areas, and to execute control such that image forming operations and exchanges of workpieces are executed alternately with respect to each of the workpiece stages.

2. The liquid droplet discharging apparatus recited in claim 1, further comprising
    a pair of image recognizing sections respectively arranged in two inspection areas positioned between the image formation area and each of the workpiece exchange areas, and configured to inspect inspection discharge results discharged onto the inspection stage,
    the control unit being configured to execute control such that the inspection stage is moved alternately between the pair of inspection areas such that inspection discharges conducted together with image forming operations and inspections of inspection discharge results conducted during subsequent image forming operations following the inspection discharges are executed alternately.

3. The liquid droplet discharging apparatus recited in claim 1, wherein
    the control unit is configured to execute control such that
        each of the workpiece stages is moved back and forth along the first direction in the image formation area a plurality of times to execute the image forming operation, and
        when a final return operation of the back and forth movements is executed, the inspection stage is moved from one inspection area to the other inspection area in synchronization with the return operation and an inspection discharge is executed in synchronization with the movement of the inspection stage.

4. The liquid droplet discharging apparatus recited in claim 2, wherein
    the control unit is configured to control a discharge inspection executed during an image forming operation such that the discharge inspection is completed by the time the image forming operation is completed.

5. The liquid droplet discharging apparatus recited in claim 1, wherein
    the image formation area has a length at least as long as the two workpiece stages in an X-axis direction,
    each of the inspection areas has a length at least as long as the inspection stage in the X-axis direction, and
    each of the workpiece exchange areas has a length at least as long as one of the workpiece stages in the X-axis direction.

6. The liquid droplet discharging apparatus recited in claim 1, wherein
    the maintenance unit has
        a suction unit configured to suck functional liquid from the functional liquid droplet discharging head, and
        a wiping unit configured to wipe a nozzle face of the functional liquid droplet discharging head.

7. The liquid droplet discharging apparatus recited in claim 1, wherein
    the head moving table includes a plurality of carriage units aligned along the second direction, and each of the carriage units includes a plurality of functional liquid droplet discharging heads.

8. The liquid droplet discharging apparatus recited in claim 7, wherein
    the head moving table is configured to move each of the carriage units independently.

9. A liquid droplet discharging apparatus configured to execute an image forming operation with respect to a workpiece by driving a functional liquid droplet discharging head while moving the workpiece back and forth along a first direction in an image formation area, the liquid droplet discharging apparatus comprising:
    a pair of workpiece stages each configured to support a workpiece thereon;
    a workpiece moving table configured to move the two workpiece stages individually in the first movement direction;
    a head moving table configured to move the functional liquid droplet discharging head in a second direction that is perpendicular to the first direction;

a maintenance unit arranged in a maintenance area separated from the image formation area in the second direction and configured to perform maintenance with respect to the functional liquid droplet discharging head;

a pair of workpiece exchanging mechanisms arranged in two workpiece exchange areas located on opposite sides of the image formation area in positions separated from the image formation area along the first direction and configured to perform exchanges of workpieces with respect to the workpiece stages;

a single inspection stage mounted on the workpiece moving table that is configured to receive an inspection discharge from the functional liquid droplet discharging head, the single inspection stage being independently movable with respect to the workpiece stages in the first movement direction; and a control unit configured to control the workpiece moving table, the head moving table, the maintenance unit, the pair of workpiece exchanging mechanisms, and the single inspection stage, the control unit being configured to execute control to move the workpiece stages alternately between the image formation area and the workpiece exchange areas such that one of the workpiece stages moves between the image formation area and one of the workpiece exchange areas and the other of the workpiece stages moves between the image formation area and the other of the workpiece exchange areas, and to execute control such that image forming operations and exchanges of workpieces are executed alternately with respect to each of the workpiece stages.

* * * * *